US012745442B2

(12) United States Patent
Mills

(10) Patent No.: US 12,745,442 B2
(45) Date of Patent: Sep. 22, 2026

(54) TRANSISTOR BACKSIDE ROUTING LAYERS WITH CONTACTS HAVING VARYING DEPTHS

(71) Applicant: Intel Corporation, Santa Clara, CA (US)

(72) Inventor: Shaun Mills, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 376 days.

(21) Appl. No.: 17/710,873

(22) Filed: Mar. 31, 2022

(65) Prior Publication Data

US 2023/0317803 A1 Oct. 5, 2023

(51) Int. Cl.

*H10D 64/23* (2025.01)
*H10D 64/01* (2025.01)
*H10D 64/62* (2025.01)
*H10D 84/85* (2025.01)

(52) U.S. Cl.

CPC ........... *H10D 64/251* (2025.01); *H10D 64/01* (2025.01); *H10D 64/62* (2025.01); *H10D 84/85* (2025.01)

(58) Field of Classification Search

CPC ....... H10D 64/251; H10D 64/62; H10D 84/85
See application file for complete search history.

(56) References Cited

U.S. PATENT DOCUMENTS 11,626,494 B2 * 4/2023 Chu .................. H10D 30/6735 257/347
2020/0294998 A1 * 9/2020 Lilak .................... H01L 23/535
2021/0358902 A1 * 11/2021 Kang .................. H10D 84/907
2021/0399109 A1 * 12/2021 Su ........................ H10D 62/121
2022/0336325 A1 * 10/2022 Lai ..................... H01L 23/5286

* cited by examiner

*Primary Examiner* — Christine S. Kim
*Assistant Examiner* — Nathalie R Fayette
(74) *Attorney, Agent, or Firm* — Schwabe, Williamson & Wyatt, P.C.

(57) ABSTRACT

Embodiments described herein may be related to apparatuses, processes, and techniques directed to creating backside routing layer in a transistor, and in particular to creating contacts with different depths in the backside routing layer in order to provide more precise connections with backside metal layers (BM0) that may be on an opposite side of a wafer. Existing openings, or holes, within a front side transistor structure that include the epitaxial layers may be used to create self-aligned contacts that extend below the epitaxial layer and into the wafer to contact BM0. Other embodiments may be described and/or claimed.

12 Claims, 10 Drawing Sheets

TRANSISTOR BACKSIDE ROUTING LAYERS WITH CONTACTS HAVING VARYING DEPTHS

FIELD

Embodiments of the present disclosure generally relate to the field of semiconductor packaging, and in particular to electrical routing layers at a backside of an epitaxial layer.

BACKGROUND

Continued growth in virtual machines, cloud computing, and portable devices will continue to increase the demand for high-density transistors within chips and packages. Transistor manufacturing includes processing portions of the transistor on both the front side as well as the backside of a wafer. In embodiments, all or portions of backside routing layers that may be directly coupled with epitaxial layers may be partially on the front side of the wafer. To electrically couple portions of backside routing layers with a backside metal 0 layer (BM0) in involves using registration techniques on the backside to align subsequent backside routing layers to existing frontside routing and contact layers. As a result, edge placement error (EPE) due to legacy registration techniques may be high and may limit the cell height scaling that could be achieved due to inaccurate placement of connections between BM0 and backside routing layers in the bonding process required for backside processing.

DETAILED DESCRIPTION

Figure 1:
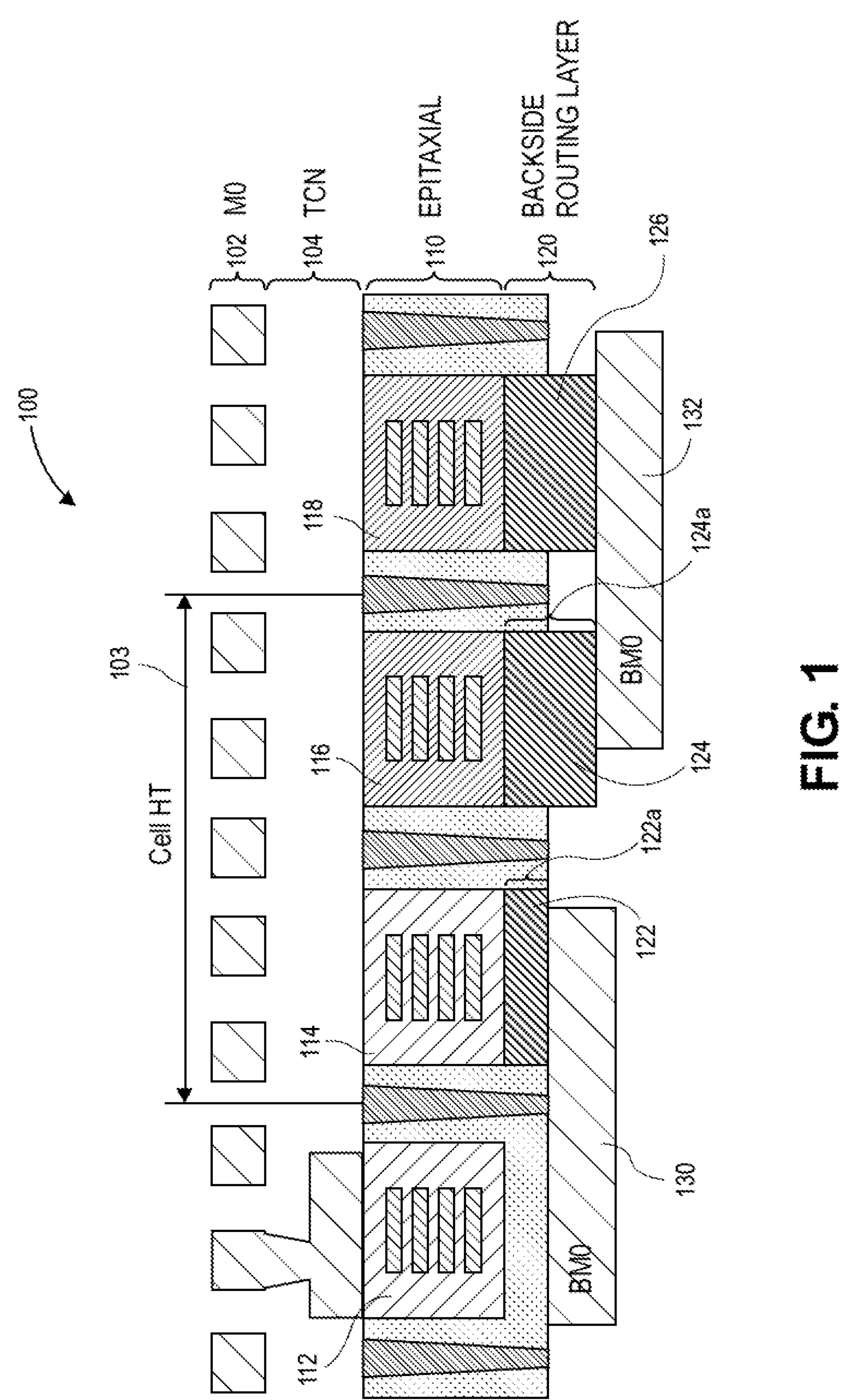
FIG. 1 shows a cross section side view of a transistor structure that includes an electrical routing layer below an epitaxial layer, where the electrical routing layer has electrical contacts that electrically couple with a metal contact layer, in accordance with various embodiments.

Embodiments described herein may be related to apparatuses, processes, systems, and techniques directed to creating backside routing layers in a transistor structure, and in particular to creating contacts within backside routing layers with different lengths in order to provide more precise connections with backside metal layers (BM0) that may be on an opposite side of a wafer. Embodiments may be directed to using existing openings, or holes, within a front side transistor structure that includes the epitaxial layers, and using the existing openings to create self-aligned contacts that extend below the epitaxial layer and contact BM0.

Transistor manufacturing now includes processing portions of the transistor on both the front side as well as the backside of a wafer. In embodiments, all or portions of backside routing layers that may be directly coupled with epitaxial layers may be partially on the front side of the wafer. To electrically couple portions of backside routing layers with BM0 in legacy implementations involves using registration techniques on the backside to align subsequent backside routing layers to existing frontside routing and contact layers.

As a result, in these legacy implementations, edge placement error (EPE) due to legacy registration techniques may be high and may limit the cell height scaling that could be achieved due to inaccurate placement of connections between BM0 and backside routing layers in the bonding process required for backside processing. In addition, inaccuracies in placement may also occur due to wafer distortions from the bonding process. As a result, additional margin is needed to account for EPE, which increases the overall cell height.

In embodiments described herein, self-aligned techniques may be used to register BM0 layers to the backside routing layers on the front of the wafer, just below the epitaxial layers. Embodiments may use existing transistor structures on the front side of the wafer to create self-aligned vias through the wafer to accurately couple with BM0 layer structures. As a result, EPE may be greatly reduced, allowing smaller cell height scaling and more robust electrical interconnections.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

FIG. 1 shows a cross section side view of a transistor structure that includes an electrical routing layer below an epitaxial layer, where the electrical routing layer has electrical contacts that electrically couple with a metal contact layer, in accordance with various embodiments. Transistor structure 100 shows a front side metal zero (M0) layer 102 that is above a trench connector layer 104 that may be used to electrically couple with a plurality of epitaxial structures 110, 112, 114, 116, 118 within epitaxial layer 110. A distance between epitaxial structure 114 and epitaxial structure 116 inclusive may be referred to as a cell height 103 (cell HT).

A backside routing layer 120 may be above a BM0 layer that includes BM0 contacts 130, 132. As shown, an electrical contact 122 of the backside routing layer 120 may electrically couple epitaxial structure 114 with a first BM0 track 130. In addition, an electrical contact 124 of the backside routing layer 120 may electrically couple epitaxial structure 116 with a second BM0 track 132, and electrical contact 126 may electrically couple epitaxial structure 118 with second BM0 track 132. In embodiments, epitaxial structures 116, 118 may be PMOS structures, and epitaxial structures 112, 114 may be NMOS structures. In embodiments, a BM0 track may also be referred to as a BM0 contact.

Note that the backside routing layer 120, including electrical contacts 122, 126 may be all or in part built within a silicon wafer. Also note that a distance **122*a* of the electrical contact 122 from epitaxial structure 114 and a distance 124*a* of the electrical contacts 124, 126 from epitaxial structure 116, 118, which may also be referred to as a depth, are different, as required to connect, respectively, with different BM0 tracks 130, 132. In embodiments, the difference may range from 10 to 40 nanometers. In other embodiments, this range may be larger. The accuracy of the placement of the electrical contacts 122, 124, 126 is very important with respect to the BM0 tracks 130, 132. For example, if the first BM0 track 130 is too close to or touching electrical contact 124, a short will result that will cause the transistor structure 100 to stop working correctly. On the other hand, there needs to be sufficient contact space, which may be referred to as overlapping, between electrical contact 122 and the first BM0 track 130** in order to ensure a robust electrical coupling.

Note that different heights of electrical contacts 122, 124, 126 within the backside routing layers 120 may be used to couple with BM0 tracks 130, 132 that may be at different levels. For example, a height **122*a* of electrical contact 122 of the backside routing layer 120 is required to couple with the first BM0 track 130 will be shorter than the height 124*a* of electrical contact 124 of the backside routing layer 120, that is required to couple with the second BM0 track 132 that is a greater depth with respect to the first BM0 track 130**.

In embodiments, and discussed in greater detail below, the placement of and the varying heights of the electrical contacts 122, 124, 126 may be performed using the techniques applied to front end processing of the transistor structure 100. In particular, using techniques applied to structural characteristics of the epitaxial layer 110 to accurately construct the electrical contacts 122, 124, 126.

Figure 2:
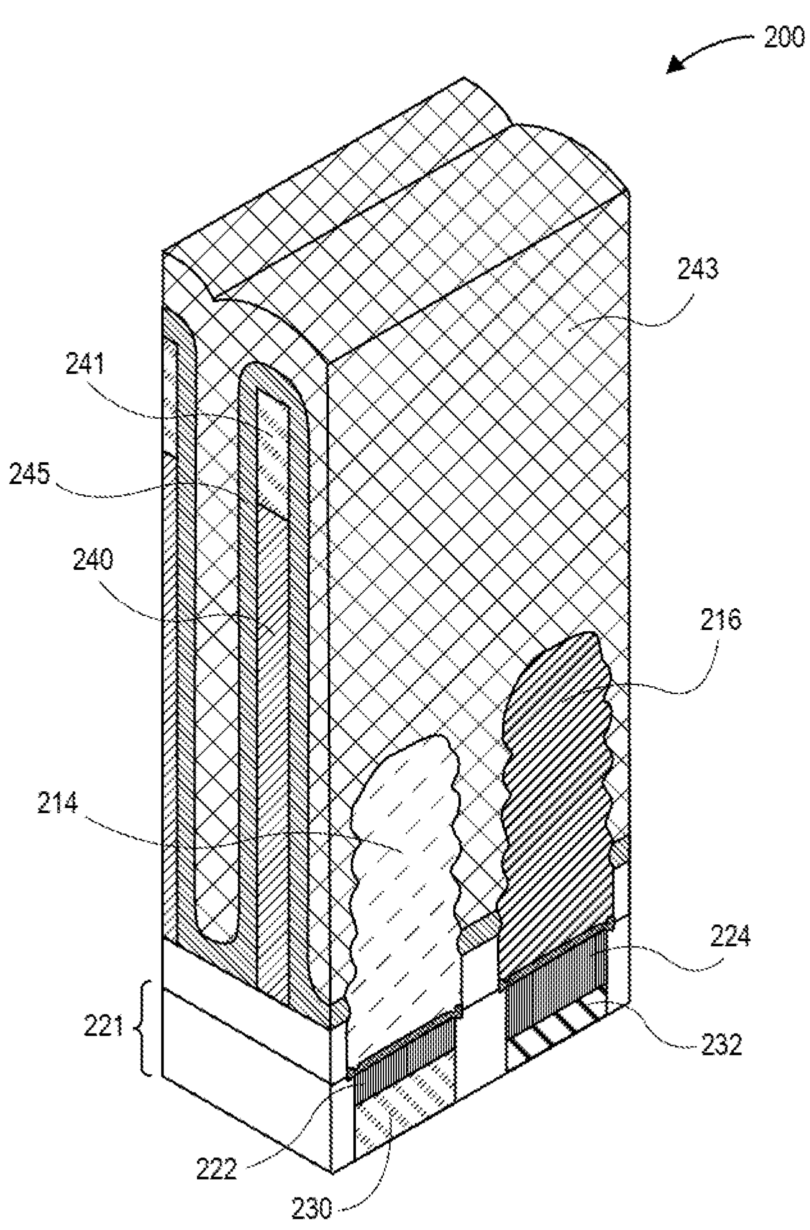
FIG. 2 is a perspective illustration of electrical connection features at different depths within an electrical routing layer that is below an epitaxial layer, in accordance with various embodiments.

FIG. 2 is a perspective illustration of electrical connection features at different depths within an electrical routing layer that is below an epitaxial layer, in accordance with various embodiments. Transistor structure 200, which may be similar to portions of transistor structure 100 of FIG. 1, includes a first epitaxial structure 214 and a second epitaxial structure 216, which may be similar to epitaxial structures 114, 116. Gate 240 extends through first epitaxial structure 214 and a second epitaxial structure 216. A sacrificial poly hard mask 241 may be above the gate 240. A gate spacer 245 may surround the gate 240, and a sacrificial placeholder oxide 243 may surround the gate spacer 245. Below the first epitaxial structure 214 is an electrical contact 222, which may be similar to electrical contact 122. Below the second epitaxial structure 216 is electrical contact 224, which may be similar to electrical contact 124. A first capping material 230 may be below electrical contact 222, and the second capping material 232 may be below electrical contact 224. The layers of the first capping material 230 and the second capping material 232 may be formed after the electrical contacts 222 and 224 are formed. Note that the electrical contact 222 and electrical contact 224, as well as part of the epitaxial structures 114, 116 may be within wafer 221.

FIGS. 3A-3H show stages in a manufacturing process for creating an electrical routing layer below an epitaxial layer with electrical connection features that are at a different depths, in accordance with various embodiments. The diagrams in FIGS. 3A-3H are perspective diagrams that may be similar to diagram 200 of FIG. 2.

Figures 3A, 3B:
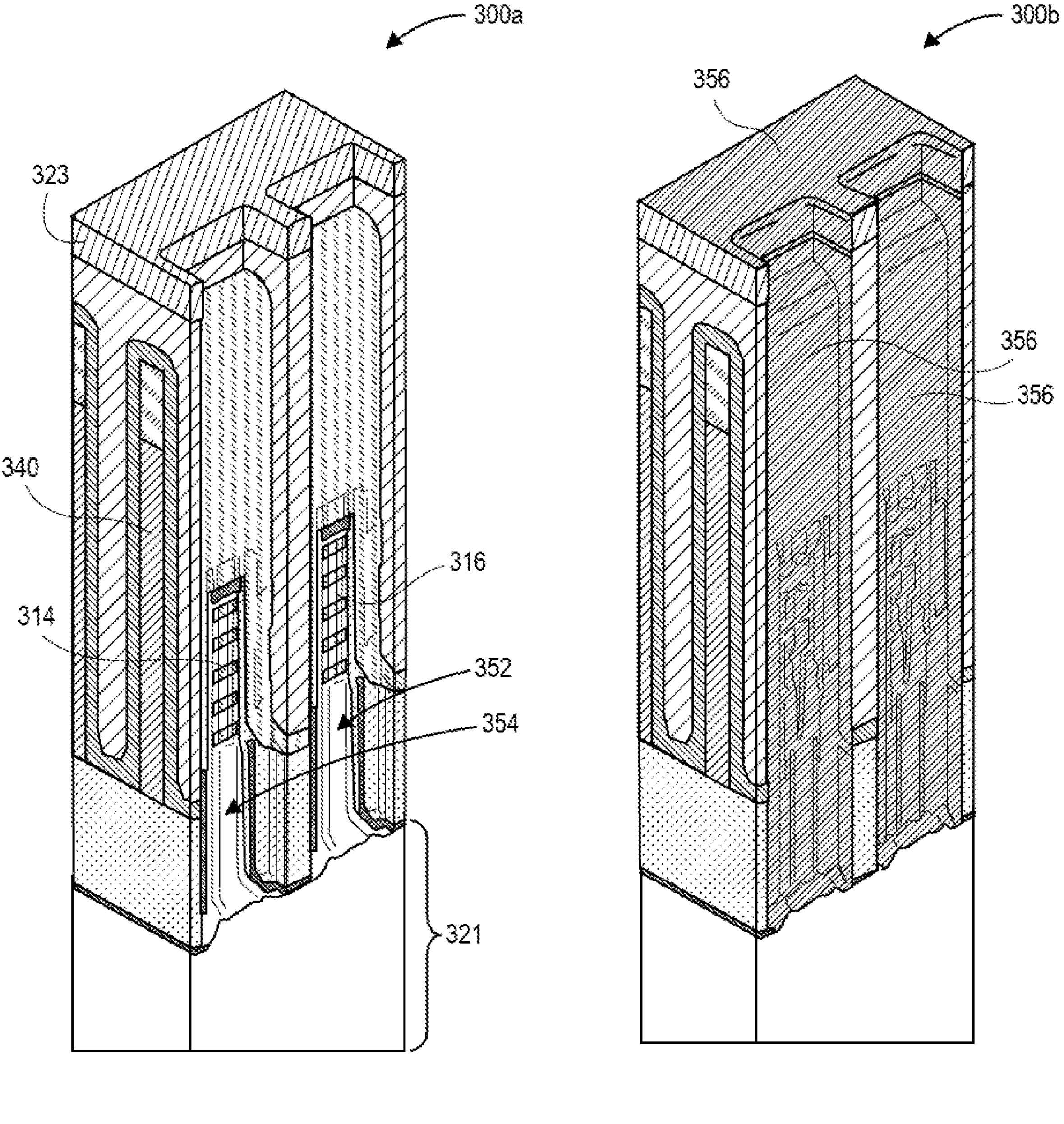
FIGS. 3A-3H show stages in the manufacturing process for creating an electrical routing layer below an epitaxial layer with electrical contacts that are at a different depths, in accordance with various embodiments.

FIG. 3A shows a stage in the manufacturing process where a portion of a transistor structure **300*a*, which may be similar to transistor structure 200 of FIG. 2, has been manufactured. Gate 340 and epitaxial structures 314, 316 are on a wafer 321. Hole 352 has been etched proximate to the epitaxial structure 316 down to the wafer 321, and hole 354 has been etched proximate to the epitaxial structure 314 and etched down to the wafer 321. In embodiments, the etching is facilitated by a patterned hard mask 323**.

FIG. 3B shows a stage in the manufacturing process where a liner 356 is placed over the transistor structure 300*b*, including in holes 352, 354. In embodiments, the liner 356 may be a hermetic liner that includes nitride or a silicon nitride (SiN). In embodiments, the liner may be applied using atomic layer deposition (ALD) to ensure coverage and hermeticity.

Figures 3C, 3D:
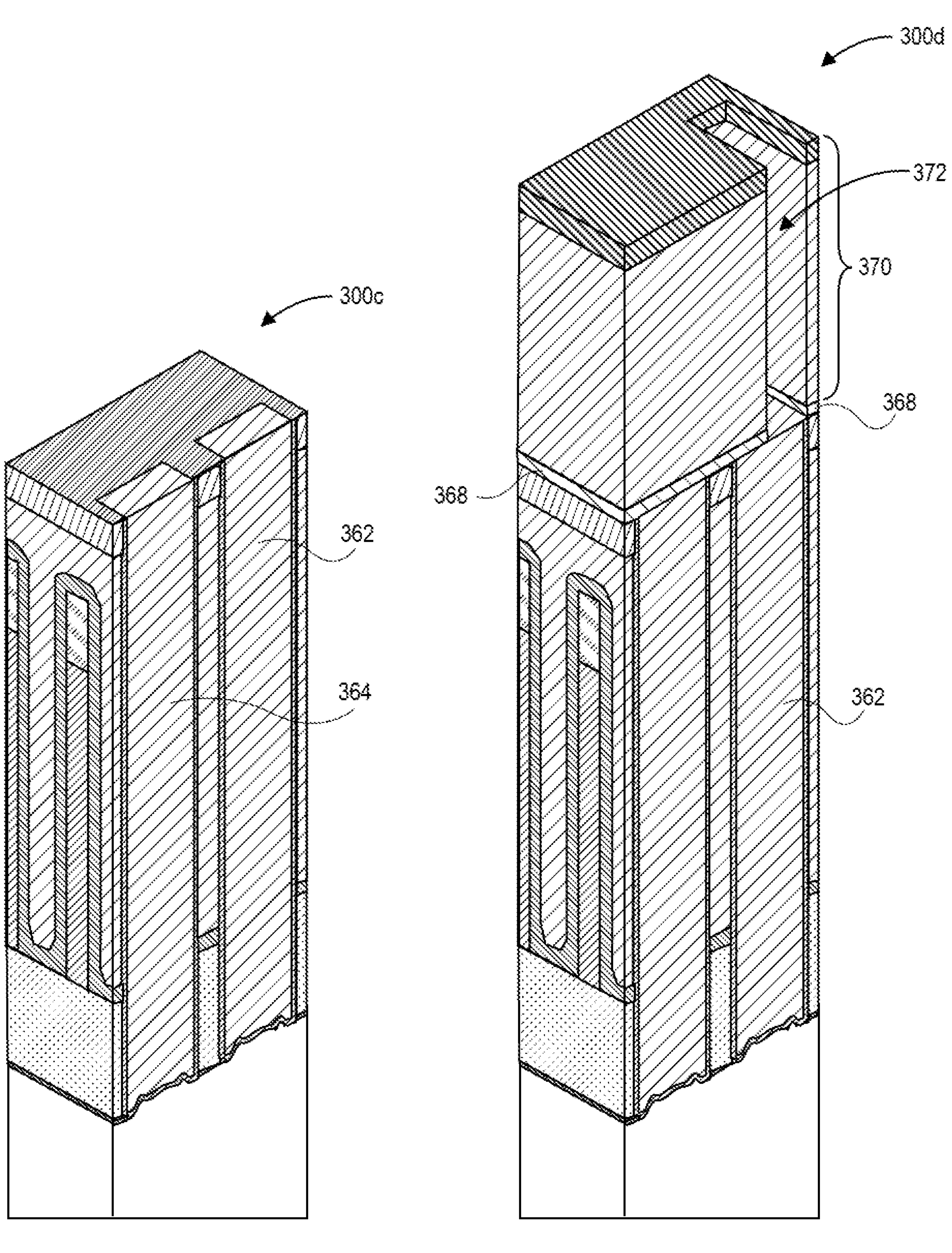

FIG. 3C shows a stage in the manufacturing process where a carbon-based material is filled into holes 352, 354, and inside the liner 356, to create carbon-based material fills 362, 364. This carbon-based material may include, but not limited to, polymer-based spin-on organics. In embodiments, a chemical mechanical polish may be performed on the top surface of the transistor structure 300*c* to smooth the surface.

FIG. 3D shows a stage in the manufacturing process where a barrier 368 is placed on top of the transistor structure 300*d*. The barrier 368 is used to protect the integrity of hole 354 while hole 352 is deepened in subsequent steps described below.

A layer 370 is patterned on top of the barrier 368, and a channel 372 is formed through the layer 370 that extends down through the barrier 368, which opens into hole 352 that is currently filled with carbon-based material 362. In embodiments, the channel 372 will be significantly smaller than the top of the hole 352 from FIG. 3A.

Figures 3E, 3F:
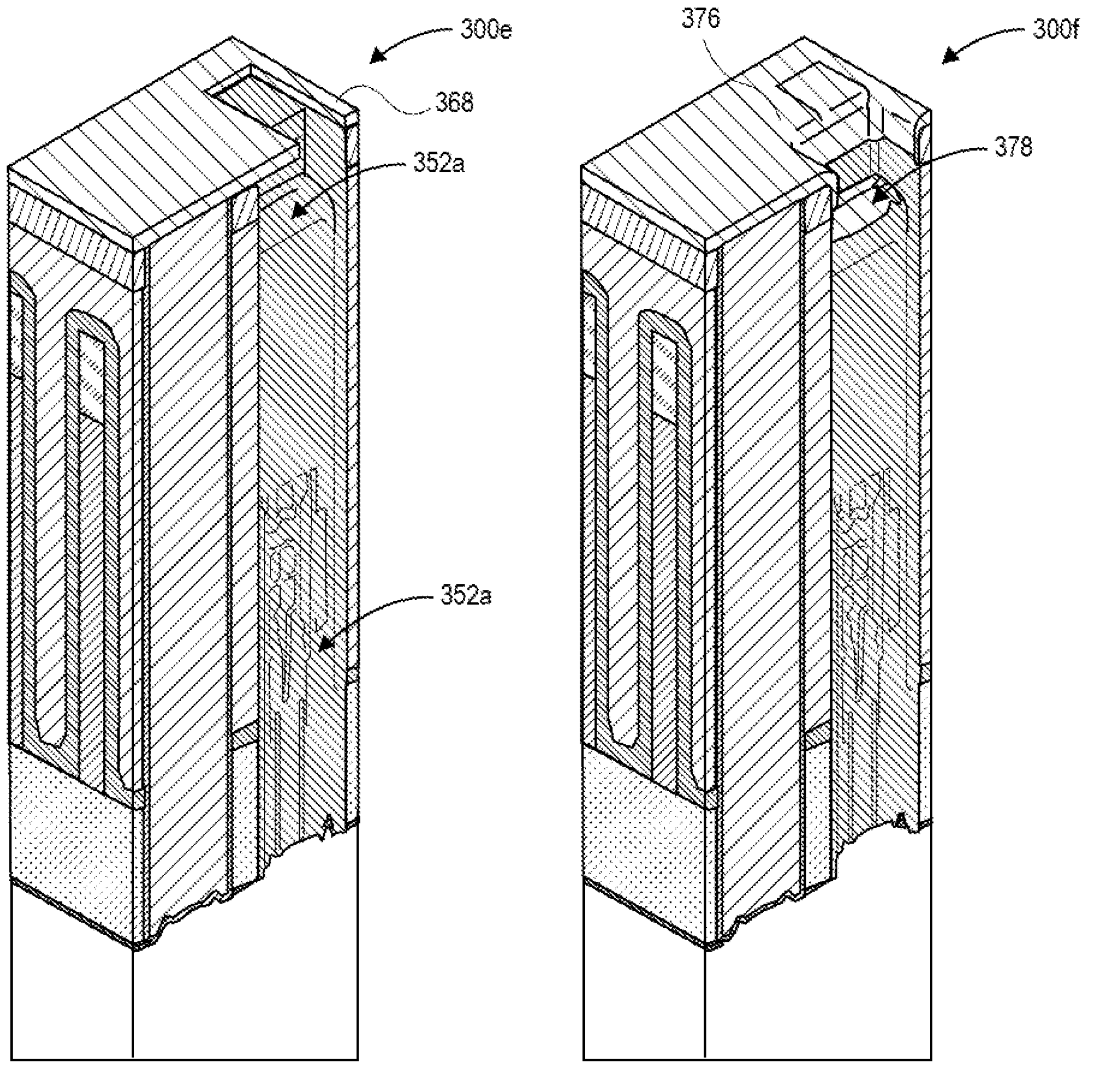

FIG. 3E shows a stage in the manufacturing process where an etch is performed on transistor structure 300*e*, through the channel 372, to remove the carbon-based material 362, leaving opening 352*a*. In embodiments, the etch may be an oxygen-based isotropic plasma etch. This process may be referred to as a "pinhole ash" process. In embodiments, the etch will remove all of the carbon-based material 362 of FIG. 3D. In embodiments, a time duration of the etch may be increased in order to make sure that all the carbon-based material 362 has been removed.

FIG. 3F shows a stage in the manufacturing process where the barrier 368 is removed from transistor structure 300*f*, and a helmet 376 is formed that has an opening 378 that is the same size as the hole 352 from FIG. 3A.

Figures 3G, 3H:
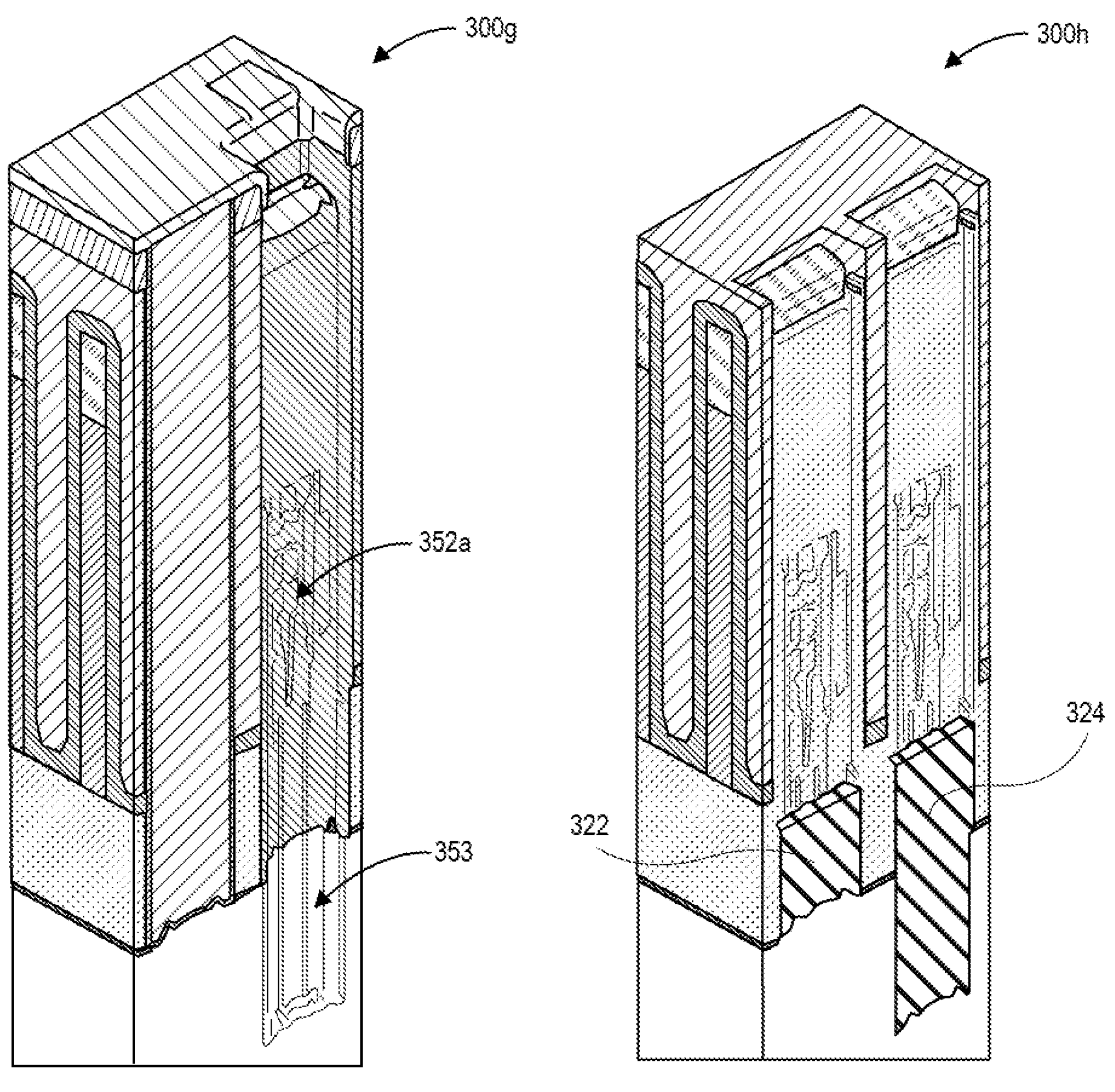

FIG. 3G shows a stage in the manufacturing process where an etch is performed to extend the hole 352*a* from transistor structure 300*g*, which may be similar to hole 352 that does not include the liner 356, to create hole extension 353. In embodiments, the etch may be a vertical etch, and may be selective to materials other than a wafer. In embodiments, this may be referred to as a self-aligned etch. In embodiments the dimensions of the hole extension 353, relative to a plane parallel to the wafer, will be the same as for hole 352*a*.

FIG. 3H shows a stage in the manufacturing process where the helmet 378 has been removed, and the carbon-based material 364 from FIG. 3C has been removed. Metal contacts 322, 324 have been inserted, which may be similar to electrical contacts 122, 124 of FIG. 1. Note that metal contact 324 is now deeper than metal contact 322. In embodiments, this may be referred to as the metal contact 324 having a greater depth, or the metal contact 324 having a greater distance than the metal contact 322.

Figure 4:
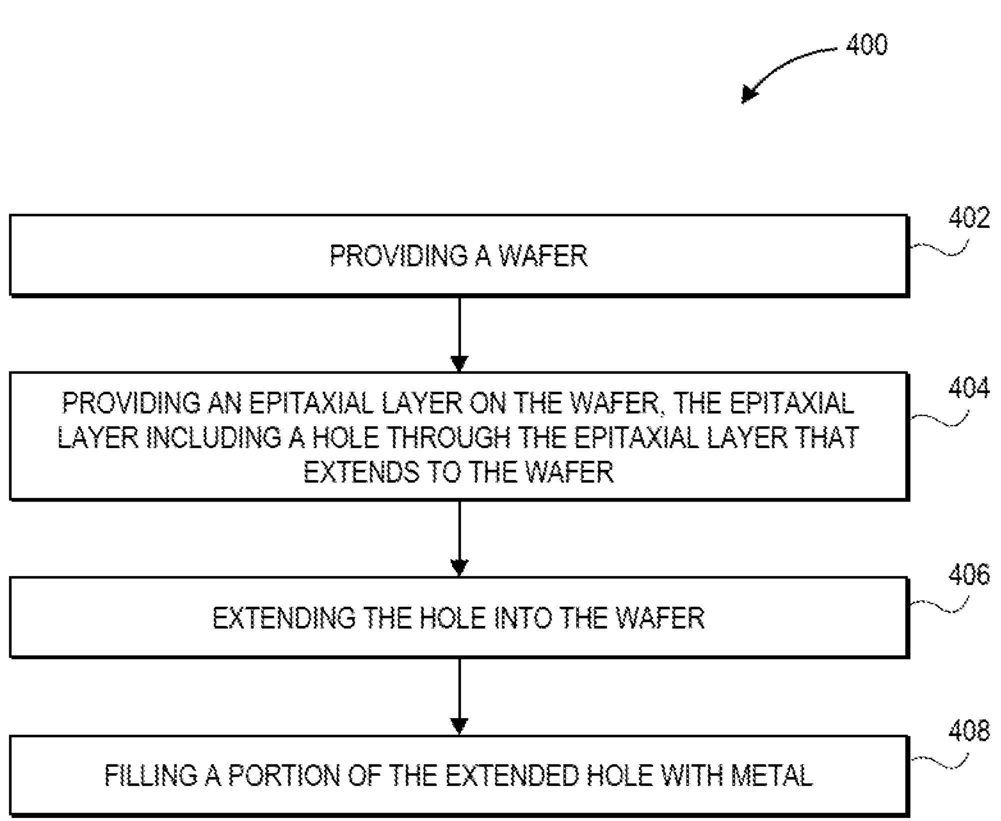
FIG. 4 illustrates an example process for manufacturing a transistor structure that includes extending an electrical contact within an electrical routing layer below an epitaxial layer into a wafer, in accordance with various embodiments.

FIG. 4 illustrates an example process for manufacturing a package that includes a hermetic seal for a transistor structure that includes metal on both sides, in accordance with various embodiments. Process 400 may be implemented using the techniques and/or embodiments described herein, and in particular with respect to FIGS. 1-3H.

At block 402, the process may include providing a wafer. In embodiments, the wafer may be similar to wafer 221 of FIG. 2, and may be similar to the wafer referred to in FIG. 1 that may contain part of backside routing layers 120. In embodiments, the wafer may be similar to a silicon substrate onto which a transistor structure may be formed.

At block 404, the process may further include providing an epitaxial layer on the wafer, the epitaxial layer including a hole through the epitaxial layer that extends to the wafer. In embodiments, the epitaxial layer may be similar to epitaxial layer 110 that includes epitaxial structures 112, 114, 116, 118, of FIG. 1. In embodiments, the epitaxial layer may be similar to epitaxial structures 214, 216 of FIG. 2, and epitaxial structures 314, 316 of FIG. 3A. In embodiments, the hole may be similar to holes 352, 354 of FIG. 3A.

At block 406, the process may further include extending the hole into the wafer. In embodiments, extending the hole in the wafer may be similar to the process described with respect to FIGS. 3A-3G. In embodiments, the extended hole may be similar to hole extension 353 of FIG. 3G.

At block 408, the process may further include filling a portion of the extended hole with metal. In embodiments, the extended hole may be similar to hole extension 353 of FIG. 3G, and the metal filling of the extended hole may be similar to metal contact 324 of FIG. 3H.

In addition to the example process as discussed above with respect to blocks 402-408, additional processes may be performed. In one embodiment, extending the hole into the wafer may further include the following process actions. The process may include applying a liner to the inside of the hole and to a surface at the top of the epitaxial layer proximate to the hole. In embodiments, the liner may be similar to liner 356 of FIG. 3B. In embodiments, the liner may include a nitride or SiN, and may provide a hermetic seal. The process may further include filling the hole with a material that includes carbon. In embodiments, the hole may be similar to holes 352, 354 of FIG. 3A. The material that includes carbon may be similar to carbon-based material fills 362, 364 of FIG. 3C. The process may further include forming a protective cap above the filled hole and the surface proximate to the hole. In embodiments, the protective may be similar to barrier 368 that is placed on top of the transistor structure 300*d* of FIG. 3D. The process may further include forming an opening through the protective cap and above the filled hole. In embodiments, the formed opening may be similar to channel 372 within layer 370, where the channel 372 extends through the barrier 368 (the protective cap) and above the filled hole 362 of FIG. 3D. The formed opening, which may be similar to channel 372, may be substantially smaller than a cross section of the filled hole 362, in order that the formed opening will land completely within the cross section of the filled hole 362.

The process may further include using the formed opening, perform an isotropic etch to remove the material that includes carbon from the hole. In embodiments, performing the isotropic etch may be similar to the process action described with respect to FIG. 3E. The process may further include performing a second etch to extend the hole into the wafer, wherein the extended portion of the hole is aligned with the hole. in embodiments, performing a second etch may be similar to the process action described with respect to FIG. 3G. The extended hole in the wafer may be similar to hole extension 353 of FIG. 3G.

In other embodiments, this process may be used for FinFET or nano-ribbon structures for non-backside contact applications. In one non-limiting example, a deep boundary via may be formed adjacent to an epitaxial layer, rather than under the epitaxial layer. Other embodiments may use this process to create different deep boundary via (DBV) depths to improve the registration between a BM0 and DBV.

Figure 5A:
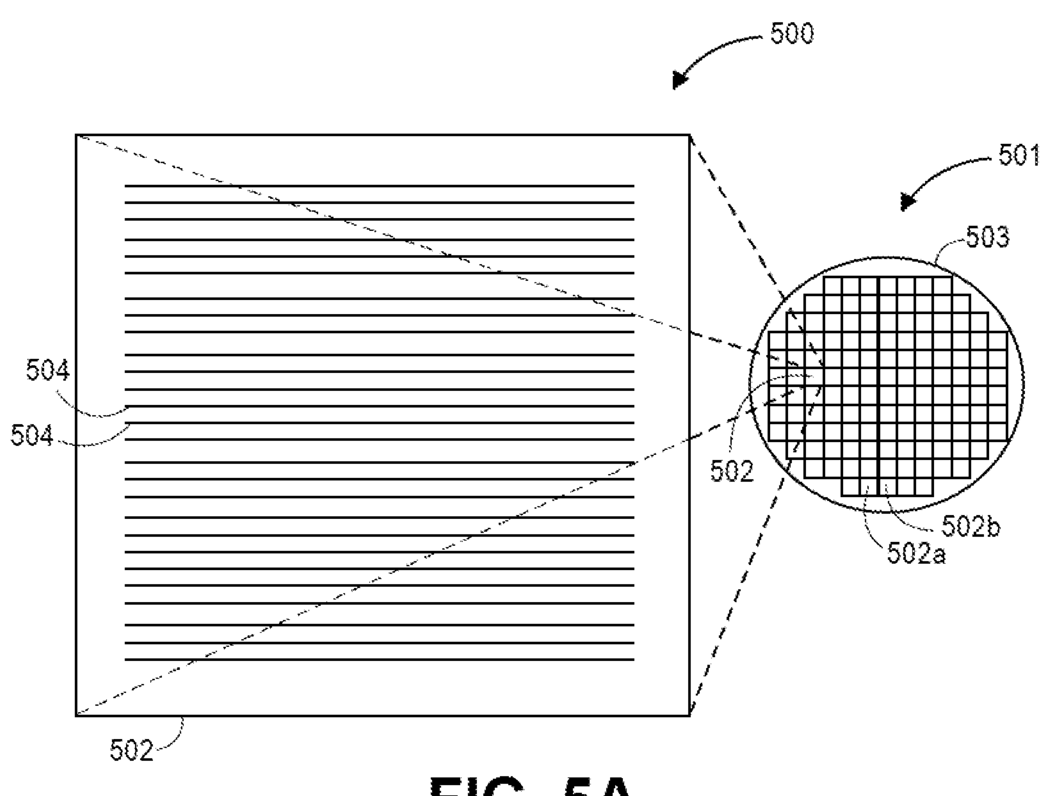
FIGS. 5A-5B schematically illustrate a top view of an example die in wafer form and in singulated form, and a cross section side view of a package assembly, in accordance with various embodiments.
Figure 5B:
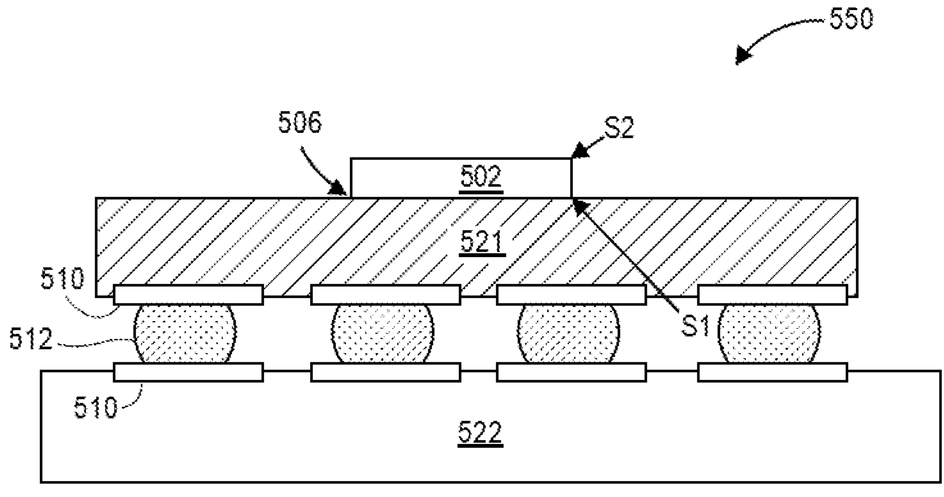

FIGS. 5A-5B schematically illustrate a top view of an example die in wafer form and in singulated form, and a cross section side view of a package assembly, in accordance with various embodiments. FIGS. 5A-5B schematically illustrate a top view of an example die in wafer form and in singulated form, and a cross section side view of a package assembly, in accordance with various embodiments. FIG. 5A schematically illustrates a top view of an example die 502 in a wafer form 501 and in a singulated form 500, in accordance with some embodiments. In some embodiments, die 502 may be one of a plurality of dies, e.g., dies 502, 502*a*, 502*b*, of a wafer 503 comprising semiconductor material, e.g., silicon or other suitable material. The plurality of dies, e.g., dies 502, 502*a*, 502*b*, may be formed on a surface of wafer 503. Each of the dies 502, 502*a*, 502*b*, may be a repeating unit of a semiconductor product that includes devices as described herein. For example, die 502 may include circuitry having elements such as capacitors and/or inductors 504 (e.g., fin structures, nanowires, and the like) that provide a channel pathway for mobile charge carriers in transistor devices. Although one or more capacitors and/or inductors 504 are depicted in rows that traverse a substantial portion of die 502, it is to be understood that one or more capacitors and/or inductors 504 may be configured in any of a wide variety of other suitable arrangements on die 502 in other embodiments.

After a fabrication process of the device embodied in the dies is complete, wafer 503 may undergo a singulation process in which each of dies, e.g., die 502, is separated from one another to provide discrete "chips" of the semiconductor product. Wafer 503 may be any of a variety of sizes. In some embodiments, wafer 503 has a diameter ranging from about 25.4 mm to about 450 mm. Wafer 503 may include other sizes and/or other shapes in other embodiments. According to various embodiments, the one or more capacitors and/or inductors 504 may be disposed on a semiconductor substrate in wafer form 501 or singulated form 500. One or more capacitors and/or inductors 504 described herein may be incorporated in die 502 for logic, memory, or combinations thereof. In some embodiments, one or more capacitors and/or inductors 504 may be part of a system-on-chip (SoC) assembly.

FIG. 5B schematically illustrates a cross-section side view of an integrated circuit (IC) assembly 550, in accordance with some embodiments. In some embodiments, IC assembly 550 may include one or more dies, e.g., die 502, electrically or physically coupled with a package substrate 521. Die 502 may include one or more capacitors and/or inductors 504 as described herein. In some embodiments, package substrate 521 may be electrically coupled with a circuit board 522 as is well known to a person of ordinary skill in the art. Die 502 may represent a discrete product made from a semiconductor material (e.g., silicon) using semiconductor fabrication techniques such as thin film deposition, lithography, etching, and the like. In some embodiments, die 502 may be, include, or be a part of a processor, memory, SoC or ASIC in some embodiments.

Die 502 can be attached to package substrate 521 according to a wide variety of suitable configurations including, for example, being directly coupled with package substrate 521 in a flip-chip configuration, as depicted. In the flip-chip configuration, an active side 51 of die 502 including circuitry is attached to a surface of package substrate 521 using hybrid bonding structures as described herein that may also electrically couple die 502 with package substrate 521. Active side 51 of die 502 may include multi-threshold voltage transistor devices as described herein. An inactive side S2 of die 502 may be disposed opposite to active side 51.

In some embodiments, package substrate 521 is an epoxy-based laminate substrate having a core and/or build-up layers such as, for example, an Ajinomoto Build-up Film (ABF) substrate. Package substrate 521 may include other suitable types of substrates in other embodiments including, for example, substrates formed from glass, ceramic, or semiconductor materials.

Package substrate 521 may include electrical routing features configured to route electrical signals to or from die 502. The electrical routing features may include pads or traces (not shown) disposed on one or more surfaces of package substrate 521 and/or internal routing features (not shown) such as trenches, vias, or other interconnect structures to route electrical signals through package substrate 521. In some embodiments, package substrate 521 may include electrical routing features such as pads (not shown) configured to receive the respective die-level interconnect structures 506 of die 502.

Circuit board 522 may be a printed circuit board (PCB) comprising an electrically insulative material such as an epoxy laminate. Circuit board 522 may include electrically-insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures such as traces, trenches, vias may be formed through the electrically insulating layers to route the electrical signals of die 502 through circuit board 522. Circuit board 522 may comprise other suitable materials in other embodiments. In some embodiments, circuit board 522 is a motherboard as is well known to a person of ordinary skill in the art.

Package-level interconnects such as, for example, solder balls 512 may be coupled to one or more pads 510 on package substrate 521 and/or on circuit board 522 to form corresponding solder joints that are configured to further route the electrical signals between package substrate 521 and circuit board 522. Pads 510 may comprise any suitable electrically conductive material such as metal including, for example, nickel (Ni), palladium (Pd), gold (Au), silver (Ag), copper (Cu), and combinations thereof. Other suitable techniques to physically and/or electrically couple package substrate 521 with circuit board 522 may be used in other embodiments.

IC assembly 550 may include a wide variety of other suitable configurations in other embodiments including, for example, suitable combinations of flip-chip and/or wire-bonding configurations, interposers, multi-chip package configurations including system-in-package (SiP), and/or package-on-package (PoP) configurations. Other suitable techniques to route electrical signals between die 502 and other components of IC assembly 550 may be used in some embodiments.

A person of ordinary skill in the art should recognize that any known semiconductor device fabricated using any known semiconductor process that may benefit from the principles described herein.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (M0SFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 6:
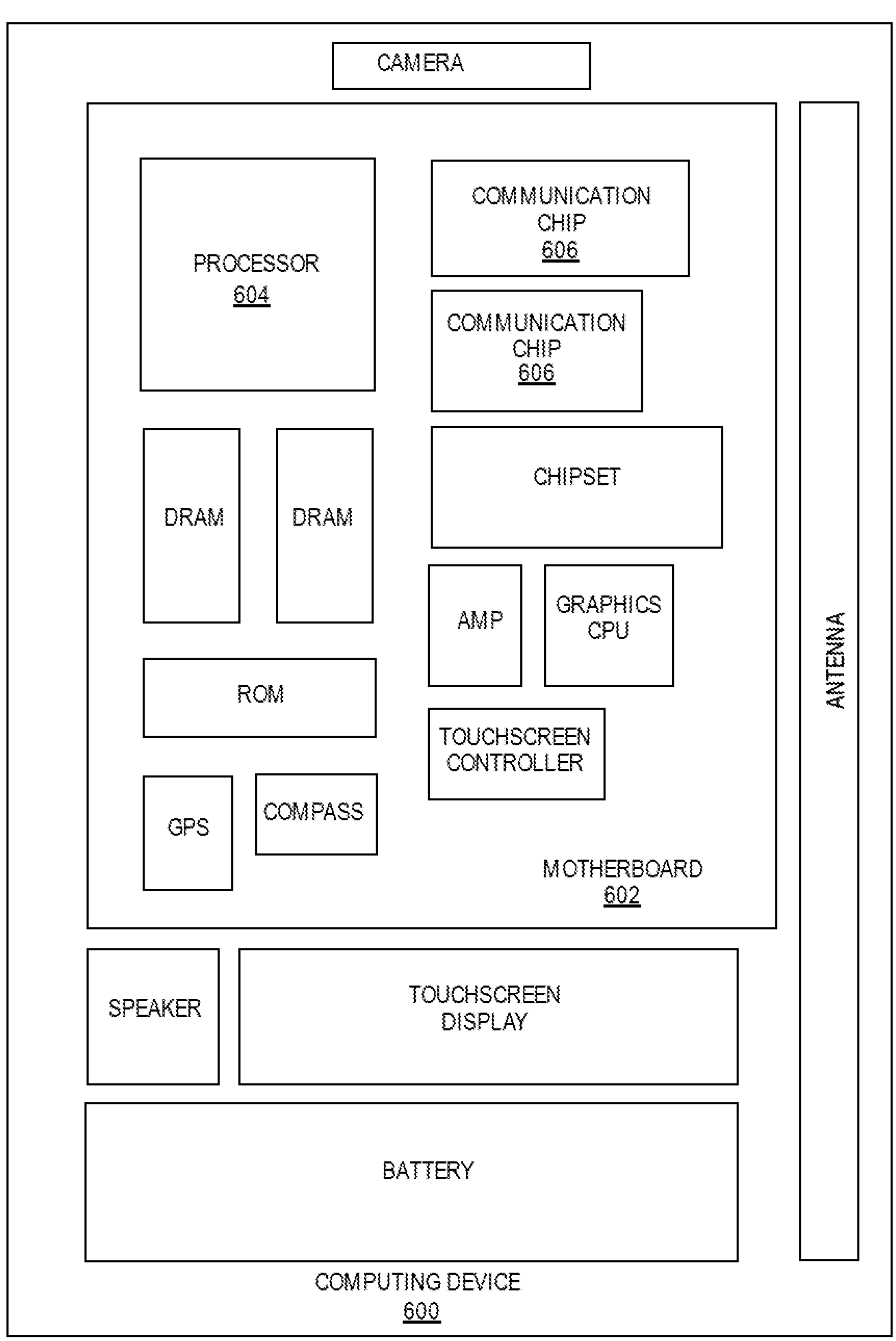
FIG. 6 illustrates a computing device in accordance with one implementation of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as MOS-FET transistors built in accordance with implementations of the invention.

In further implementations, another component housed within the computing device 600 may contain an integrated circuit die that includes one or more devices, such as MOS-FET transistors built in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
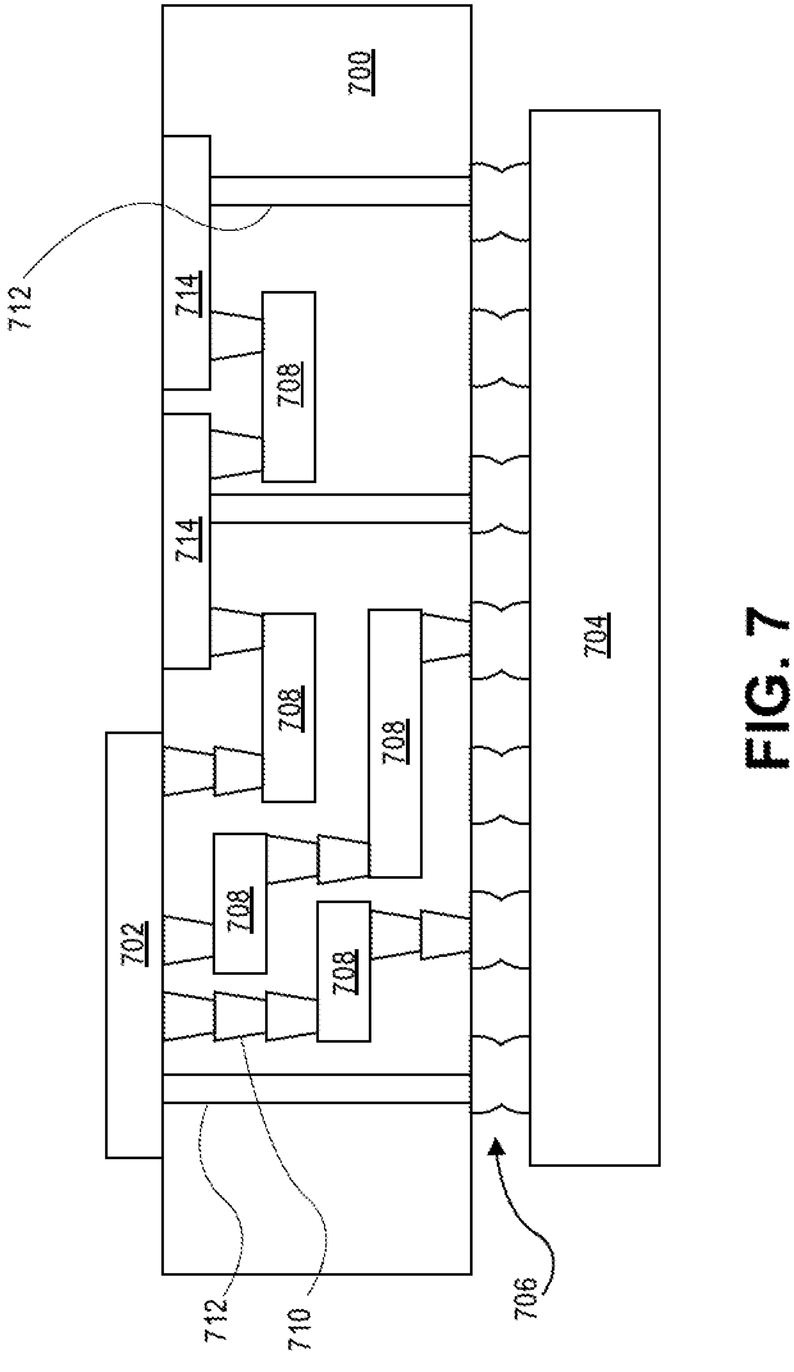
FIG. 7 illustrates an interposer that includes one or more embodiments of the invention.

FIG. 7 illustrates an interposer 700 that includes one or more embodiments of the invention. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer 700 may be formed of alternate rigid or flexible materials that may include the same materials described above for use in a semiconductor substrate, such as silicon, germanium, and other group III-V and group IV materials.

The interposer 700 may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the invention, apparatuses or processes disclosed herein may be used in the fabrication of interposer 700.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is a transistor structure comprising: an epitaxial layer; an electrical routing layer that includes a plurality of electrical contacts, the electrical routing layer is at a backside of the epitaxial layer and electrically couples with the epitaxial layer; a metal contact layer below the electrical routing layer, wherein the plurality of electrical contacts electrically couple portions of the epitaxial layer with portions of the metal contact layer; and wherein a first of the plurality of electrical contacts extends from the epitaxial layer at a first distance, wherein a second of the plurality of electrical contacts extends from the epitaxial layer at a second distance, and wherein the first distance is not equal to the second distance.

Example 2 includes the transistor structure of example 1, or of any other example or embodiment described herein, wherein the electrical routing layer includes a plurality of electrical routing layers.

Example 3 includes the transistor structure of example 1, or of any other example or embodiment described herein, wherein the first or second of the plurality of electrical contacts extends from a bottom of the epitaxial layer.

Example 4 includes the transistor structure of example 3, or of any other example or embodiment described herein, wherein the first of the plurality of electrical contacts is directly below an NMOS epitaxial structure, and wherein the second of the plurality of electrical contacts is directly below a PMOS epitaxial structure.

Example 5 includes the transistor structure of example 1, or of any other example or embodiment described herein, wherein the plurality of electrical contacts are in a silicon layer underneath the epitaxial layer.

Example 6 includes the transistor structure of example 5, or of any other example or embodiment described herein, wherein the silicon layer is a portion of a fabrication wafer.

Example 7 includes the transistor structure of example 1, or of any other example or embodiment described herein, wherein the metal contact layer is a backside metal zero (BM0) layer.

Example 8 includes the transistor structure of example 1, or of any other example or embodiment described herein, wherein the metal contact layer includes a plurality of metal contact layers; wherein the first of the plurality of electrical contacts electrically couples with a first of the plurality of metal contact layers, and wherein the second of the plurality of electrical contacts electrically couples with a second of the plurality of metal contact layers; and wherein the first of the plurality of metal contact layers and the second of the plurality of metal contact layers are electrically isolated from each other.

Example 9 includes the transistor structure of example 1, or of any other example or embodiment described herein, wherein a third of the plurality of electrical routing layers is not electrically coupled with the metal contact layer.

Example 10 includes the transistor structure of example 1, or of any other example or embodiment described herein, wherein the plurality of electrical contacts and the metal contact layer include copper.

Example 11 is a method comprising: providing a wafer; providing an epitaxial layer on the wafer, the epitaxial layer including a hole through the epitaxial layer that extends to the wafer; extending the hole into the wafer; and filling a portion of the extended hole with metal.

Example 12 includes the method of example 11, or of any other example or embodiment described herein, wherein extending the hole into the wafer further includes: applying a liner to the inside of the hole and to a surface at the top of the epitaxial layer proximate to the hole; filling the hole with a material that includes carbon; forming a protective cap above the filled hole and the surface proximate to the hole; forming an opening through the protective cap and above the filled hole; using the formed opening, perform an isotropic etch to remove the material that includes carbon from the hole; and performing a second etch to extend the hole into the wafer, wherein the extended portion of the hole is aligned with the hole.

Example 13 includes the method of example 12, or of any other example or embodiment described herein, wherein the liner includes a nitride.

Example 14 includes the method of example 12, or of any other example or embodiment described herein, wherein the isotropic etch is an oxygen-based tropic plasma etch.

Example 15 includes the method of example 12, or of any other example or embodiment described herein, wherein the protective cap is a hard mask.

Example 16 includes the method of example 12, or of any other example or embodiment described herein, wherein the hole is a first hole, and wherein the protective cap covers a second hole proximate to the first hole.

Example 17 includes the method of example 12, or of any other example or embodiment described herein, further comprising removing the protective cap.

Example 18 is a device comprising: a transistor structure comprising: an epitaxial layer; an electrical routing layer that includes a plurality of electrical connection features, the electrical routing layer is below the epitaxial layer and electrically couples with the epitaxial layer; a metal contact layer below the electrical routing layer, wherein the plurality of electrical connection features electrically couple portions of the epitaxial layer with portions of the metal contact layer; and wherein a first of the plurality of electrical connection features extends from the epitaxial layer to the metal contact layer at a first distance, wherein a second of the plurality of electrical connection features extends from the epitaxial layer to the metal contact layer at a second distance, and wherein the first distance is not equal to the second distance; and metal contacts at a top portion of the epitaxial layer.

Example 19 includes the device of example 18, or of any other example or embodiment described herein, wherein the metal contacts at the top portion of the epitaxial layer are a portion of a metal zero (M0) layer.

Example 20 includes the device of example 18, or of any other example or embodiment described herein, wherein the plurality of electrical connection features and the metal contact layer include copper.

What is claimed is:

1. A transistor structure comprising:

an epitaxial layer with a front side and a backside opposite the front side, the backside of the epitaxial layer between the front side and a backside metal zero (BM0) layer;

an electrical routing layer that includes a plurality of electrical contacts, the electrical routing layer is at the backside of the epitaxial layer and electrically couples with the epitaxial layer;

a metal contact layer below the electrical routing layer, wherein the plurality of electrical contacts electrically couple portions of the epitaxial layer with portions of the metal contact layer; and wherein a first of the plurality of electrical contacts extends from the epitaxial layer at a first distance, wherein a second of the plurality of electrical contacts extends from the epitaxial layer at a second distance, wherein the first distance is not equal to the second distance such that a bottommost surface of the first of the plurality of electrical contacts is at a different level than a bottommost surface of the second of the plurality of electrical contacts, and wherein the first of the plurality of electrical contacts has an uppermost surface at a same level as an uppermost surface of the second of the plurality of electrical contacts, the uppermost surface of the first of the plurality of electrical contacts beneath and in contact with a bottom surface of a first epitaxial source or drain structure of the epitaxial layer, and the uppermost surface of the second of the plurality of electrical contacts beneath and in contact with a bottom surface of a second epitaxial source or drain structure of the epitaxial layer.

2. The transistor structure of claim 1, wherein the electrical routing layer includes a plurality of electrical routing layers.

3. The transistor structure of claim 1, wherein the first of the plurality of electrical contacts is directly below an NMOS epitaxial structure, and wherein the second of the plurality of electrical contacts is directly below a PMOS epitaxial structure.

4. The transistor structure of claim 1, wherein the plurality of electrical contacts are in a silicon layer underneath the epitaxial layer.

5. The transistor structure of claim 4, wherein the silicon layer is a portion of a fabrication wafer.

6. The transistor structure of claim 1, wherein the metal contact layer is the backside metal zero (BM0) layer.

7. The transistor structure of claim 1, wherein the metal contact layer includes a plurality of metal contact layers;

wherein the first of the plurality of electrical contacts electrically couples with a first of the plurality of metal contact layers, and wherein the second of the plurality of electrical contacts electrically couples with a second of the plurality of metal contact layers; and wherein the first of the plurality of metal contact layers and the second of the plurality of metal contact layers are electrically isolated from each other.

8. The transistor structure of claim 1, wherein a third of the plurality of electrical routing layers is not electrically coupled with the metal contact layer.

9. The transistor structure of claim 1, wherein the plurality of electrical contacts and the metal contact layer include copper.

10. A device comprising:

a transistor structure comprising:

an epitaxial layer;

an electrical routing layer that includes a plurality of electrical connection features, the electrical routing layer is below the epitaxial layer and electrically couples with the epitaxial layer;

a metal contact layer below the electrical routing layer, wherein the plurality of electrical connection features electrically couple portions of the epitaxial layer with portions of the metal contact layer; and wherein a first of the plurality of electrical connection features extends from the epitaxial layer to the metal contact layer at a first distance, wherein a second of the plurality of electrical connection features extends from the epitaxial layer to the metal contact layer at a second distance, wherein the first distance is not equal to the second distance such that a bottommost surface of the first of the plurality of electrical connection features is at a different level than a bottommost surface of the second of the plurality of electrical connection features, and wherein the first of the plurality of electrical connection features has an uppermost surface at a same level as an uppermost surface of the second of the plurality of electrical connection features, the uppermost surface of the first of the plurality of electrical connection features beneath and in contact with a bottom surface of a first epitaxial source or drain structure of the epitaxial layer, and the uppermost surface of the second of the plurality of electrical connection features beneath and in contact with a bottom surface of a second epitaxial source or drain structure of the epitaxial layer; and metal contacts at a top portion of the epitaxial layer.

11. The device of claim 10, wherein the metal contacts at the top portion of the epitaxial layer are a portion of a metal zero (M0) layer.

12. The device of claim 10, wherein the plurality of electrical connection features and the metal contact layer include copper.

* * * * *